United States Patent [19]
Gordecki et al.

[11] Patent Number: 5,469,982
[45] Date of Patent: Nov. 28, 1995

[54] FOUR-SIDED HOUSING LATCH

[75] Inventors: Ryszard J. Gordecki; Kian T. Tan, both of Singapore, Singapore

[73] Assignee: Motorola, Inc., Schaumburg, Ill.

[21] Appl. No.: 294,297

[22] Filed: Aug. 23, 1994

[51] Int. Cl.[6] ........................................ B65D 6/24
[52] U.S. Cl. ...................... 220/4.02; 220/4.21; 220/4.33; 220/648; 220/686
[58] Field of Search .................... 220/4.02, 4.21, 220/4.33, 648, 683, 686, 691, 692, DIG. 13

[56]  References Cited

U.S. PATENT DOCUMENTS

| | | | |
|---|---|---|---|
| Re. 32,762 | 10/1988 | Katzmann et al. | 220/4.02 |
| 2,750,064 | 6/1956 | Clarke | 220/686 |
| 2,991,899 | 7/1961 | Montalbano | 220/683 |
| 3,124,266 | 3/1964 | Morgan | 220/4.02 |
| 3,519,162 | 7/1970 | Peterson et al. | 220/4.21 |
| 4,274,545 | 6/1981 | Peroni | 220/4.02 |
| 5,207,342 | 5/1993 | Tsuji et al. | 220/4.02 |
| 5,358,134 | 10/1994 | Ripley et al. | 220/4.21 |

FOREIGN PATENT DOCUMENTS

| | | | |
|---|---|---|---|
| 263968 | 10/1963 | Australia | 220/4.02 |

OTHER PUBLICATIONS

"Firestorm"™ Tone–And–Voice Alert Pager, Motorola Service Manual, pp. 1–3 and 12, ©1993 by Motorola, Inc., Paging Products Group.

*Primary Examiner*—Stephen J. Castellano
*Attorney, Agent, or Firm*—Philip P. Macnak; Juliana Agon; John H. Moore

[57]  ABSTRACT

A resilient latch (70) and a method of attaching the latch to a pair of interlocked housings (50) having a recessed border and mating cavities (377) in the recessed border. Placed around the border of the paired housings, the latch having protrusions (727) engages with the cavities of the paired housings, as the latch is slid around the border.

8 Claims, 6 Drawing Sheets

5,469,982

FOUR-SIDED HOUSING LATCH

CROSS REFERENCE TO RELATED APPLICATIONS

This application is related to U.S. application filed on the same day as the present invention, entitled "A CONFINED BATTERY DOOR" and assigned to Motorola, Inc.

1. Technical Field

This invention relates in general to latches and in particular to a latch for fastening the front and back housings of an electronic device, such as a pager.

2. Background

As the trend for communication devices, such as selective radio receivers, commonly called pagers, to be smaller and smaller, it is harder to enclose the electronics within the pager with a small enough front and back housing that can be fastened together easily without increasing the size of the pager with the fastening means.

Accordingly, there is a need for a robotic capable latching means that recedes into the housing instead of adding size to the housing.

SUMMARY OF THE INVENTION

Briefly, according to the invention, there is provided a resilient latch and a method of attaching the latch to a pair of interlocked housings having a recessed border and mating cavities in the recessed border. Placed around the border of the paired housings, the latch having protrusions engages with the cavities of the paired housings, as the latch is slid around the border.

DETAILED OF THE PREFERRED EMBODIMENT

Figure 1:
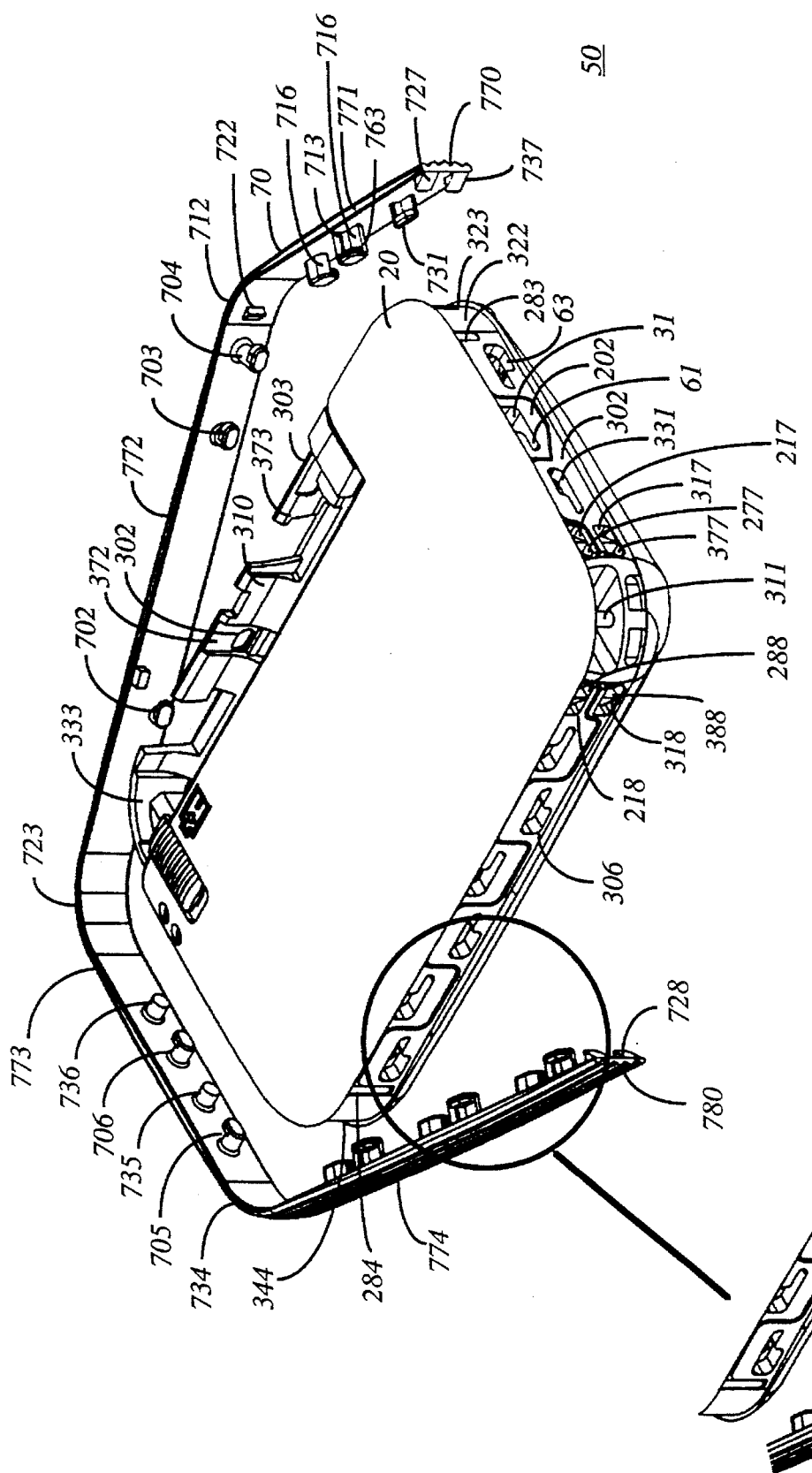
FIG. 1 is a back view of an assembled pager housing and a resilient peripheral latch to be attached, in accordance with the present invention.

Referring to FIG. 1, a back view of an assembled selective radio or pager housing 50, without a battery door (not shown) and a resilient peripheral latch or retainer 70 attached, is illustrated. Without a battery door attached, a back housing 20 can be viewed as cut-away to form a substantially rectangular opening having a long side and a short side. This opening may be of any other shape to accommodating a correspondingly shaped battery (not shown) which is usually in the shape of a cylinder. Correspondingly, a substantially cylindrically or rectangularly shaped battery cell compartment 31 0 is formed from the recessed walls of a front housing 30 for receiving the battery.

Both housings 20 and 30 and latch 70 are fabricated from a resilient material such as polycarbonate, commonly called plastic. However, the latch 70 is made thin enough to provide elasticity and to fit preferably within the recess provided by the recessed peripheral frame or wall of the assembled housings.

Referring to FIGS. 1–4, various means for fastening the back housing to the front housing can be integrally formed on the housing themselves. For example, the walls of both of these housings are slotted and recessed to form a plurality of tabs 302 and 202 on the front and back housings, respectively.

Figure 2:
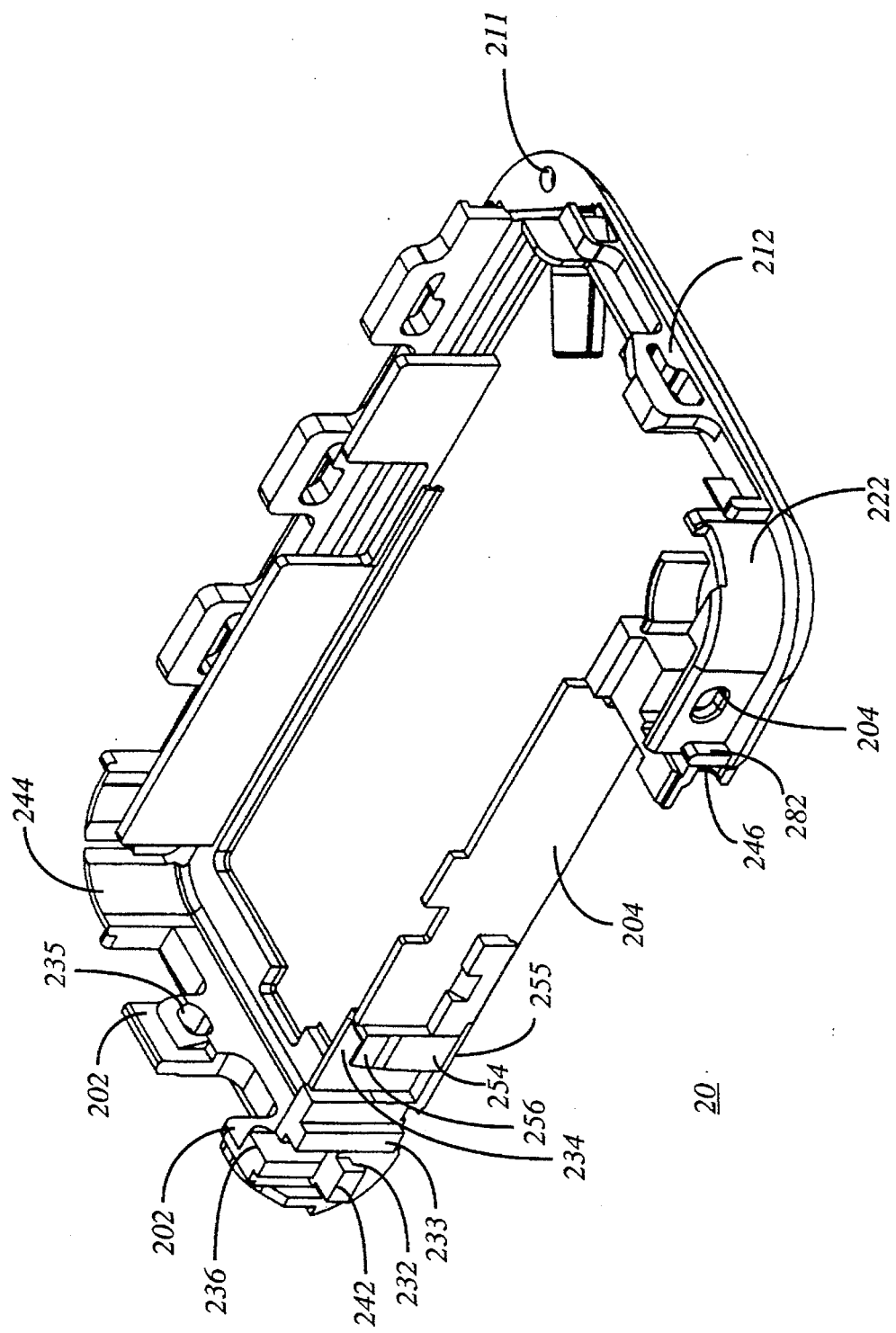
FIG. 2 is an illustration of the back housing 20 of FIG. 1, in accordance with the present invention.
Figure 3:
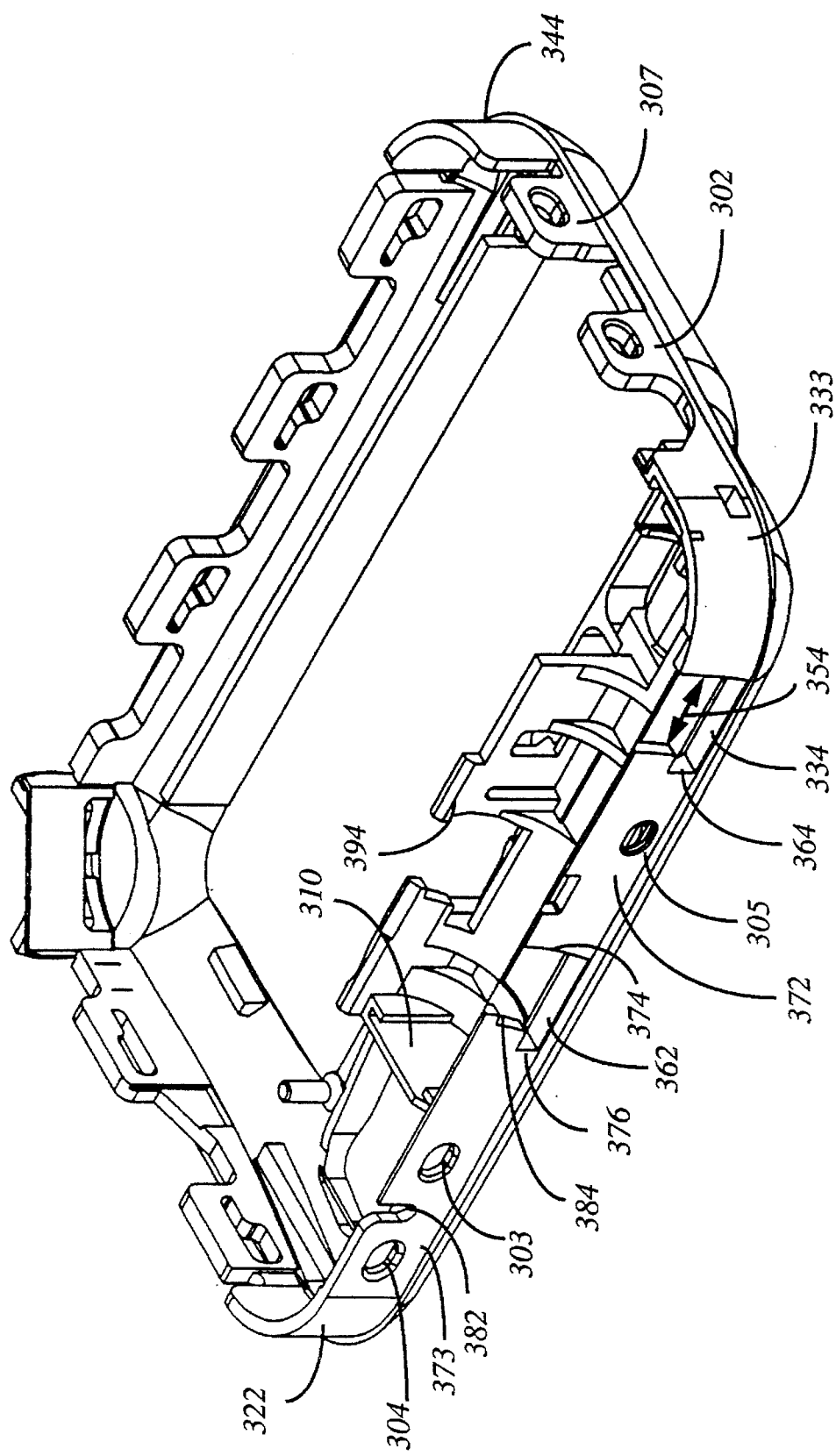
FIG. 3 is an illustration of the front housing 30 of FIG. 1, in accordance with the present invention.
Figure 4:
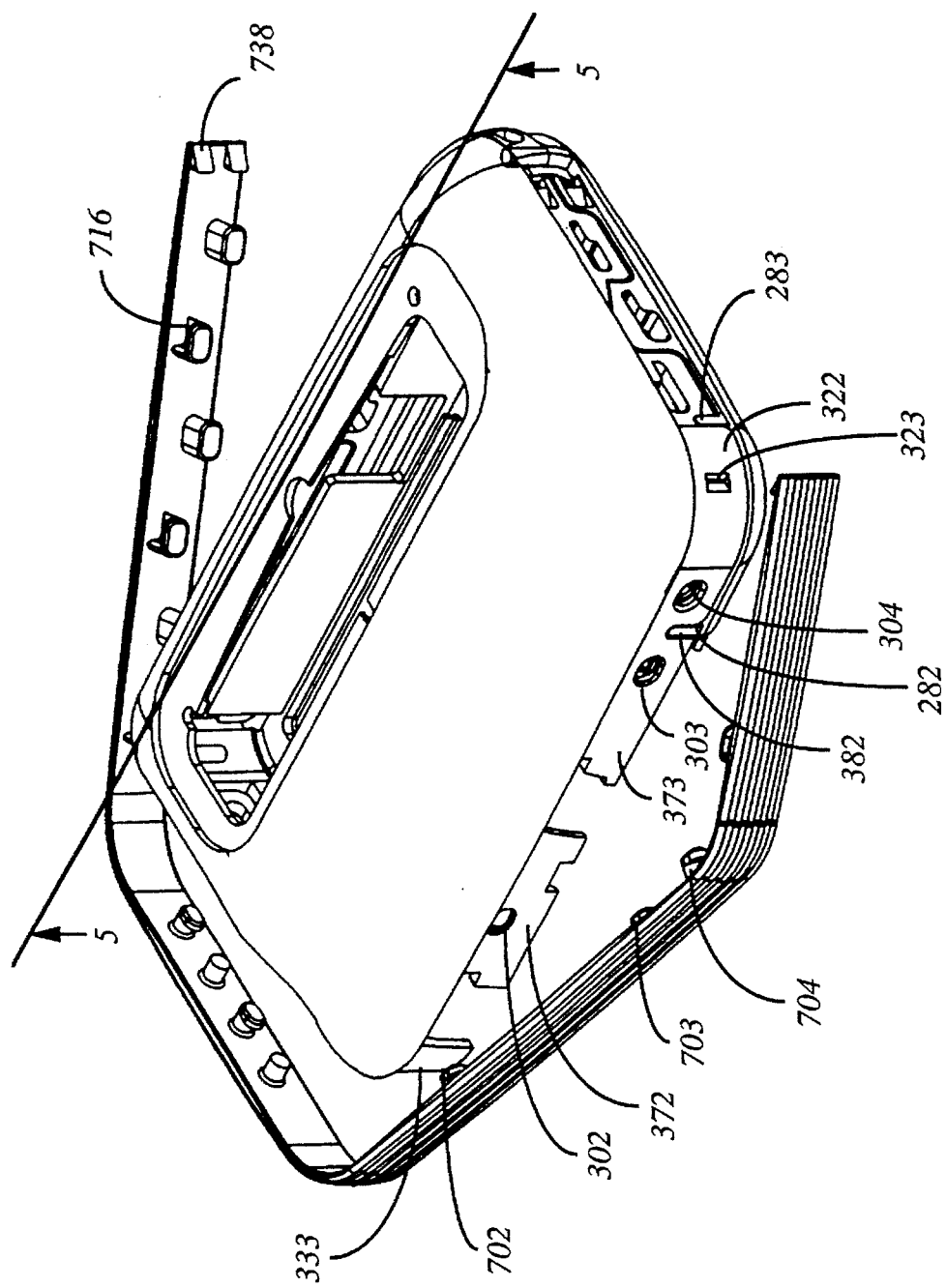
FIG. 4 is a front view of an assembled pager housing and a resilient peripheral latch to be attached, in accordance with the present invention.

Hence, in accordance with the teachings of the present invention, the pager housing assembly includes a first or front housing 30, as seen in FIG. 3, having a first pattern of recessed and perforated side-wall tabs 302. Correspondingly, a second or back housing, as seen in FIG. 2, having a second pattern of perforated and recessed side-wall tabs 202 interlocks with the front housing 302 to form the assembled pager housing assembly. A resilient latch 70 can then be robotically clamped or slid over the space left by the recessed first and second patterns of perforated side-wall tabs to interconnect both housings since the latch has various protrusions 731 for retaining the latch to the apertures or cavities 331 of the tabs.

For better interlocking capability, the perforated tabs 202 of the pager back housing 20 alternate with the perforated tabs 302 of the front housing in a complementary UP and DOWN snake-like manner, substantially all around the periphery of the housings. However, to allow access to the battery cell compartment 310, only the tabs 372 and 373 of the front housing on the battery cell side are perforated with apertures 303–305 as seen in FIG. 3 for receiving corresponding projections 702–704 of the latch.

In addition, other means for fastening the back housing to the front housing can be integrally formed on the housing themselves, in various combinations and interchangeable on the back or the front housing. For example, a narrow tapered tab 282, between the two apertures 303 and 304, protruded from the back housing is aligned with and can be received by a corresponding finger-shaped slot 382 cut in the front housing to substantially align and interlock both housings. Similarly, other narrow tapered tabs, such as the ones shown as 283 and 284, along with their respective receiving slots, situated around opposed corner tabs of the housings provide additional alignment and interlocking support.

Off course, various shapes of tabs can be used. Some tabs like tab 306, along the longer side of the housing can be more rectangular in shape while the tabs 307 along the shorter side of the housing where part of the battery compartment is located, may be more squarish to accommodate more tabs for better interlockability. Optionally, some of the tabs 212 can have sloping sides to facilitate insertion and alignment of the two housings. Other tabs, such as the battery cell compartment tabs 372 and 373 can be of irregular shapes.

As another means of interlocking the housings together by their own structure, a pin 311 of the front housing is aligned and received by a tapered cavity 211 of the back housing, at a first or starting corner of the housings.

Since the latch 70 is made capable of preferably fitting around a recessed border or band formed by the various recessed tabs, no matter what shape, all the corner tabs are rounded. For example, corner tabs, such as tab 322 overlapping tab 222, of the front and back housings, respectively, on a second corner, a non-overlapped corner tab on a third corner 333 of the front housing, and tab 344 overlapping tab 244, of the front and back housings, respectively, on a fourth corner are hence rounded to allow the latch to also have rounded corners. This rounded contour of the latch and housing walls provides flexibility in the latch to ensure against latch breakage around undesirable sharp corners. The roundness of the latch corners also provide some longitudinal or other dimensional tolerance compensation and springiness or elasticity to the latch.

Thus, to conform to the shape of the examplary housings 20 and 30, when attached, the latch 70 is preferably in the shape of an open-ended trapezium having a first shortest side 771 shortened by a first open end 770. A second or the longest side 772 is connected to the first side by a first-to-second rounded corner 712. Similarly, a third or next to the shortest side 773 is connected to the second side by a second-to-third rounded corner 723. Likewise, a fourth or next to longest side 774 having a second open end 780 is connected to the third side by a third-to-fourth rounded corner 734. At least one opposed pair of locking members are disposed at the first and second open ends 770 and 780 for securing the latch around the various cavities of the housings. Optionally, various other types of locking members, such as appropriately shaped protrusions can also be provided on numerous sides of the latch for better latch retention with suitably shaped mating means of the housings.

Hence, along with the overlapping corner tabs 322 and 222, overlapping apertures 304 and 204 also provide additional support when a longer L-shaped engagement hook 704, in the form of a circular projected foot of the latch 70 is attached or hooked within the apertures. Optionally, more of the tabs and apertures can be overlapped if additional support is required.

Smaller projected feet 703, 702 on a second (long) side 772 and 705 and 706 on a third side (short) 773 of the latch 70 similarly hook onto stretched circular or oblong apertures such as 303 and 302 of the front housing. Alignment stubs or engagement pins 735 and 736 on the third side 773 of the latch fit in similarly stretched circular apertures 235 and 236, respectively. At the second rounded corner 712 of the latch, a triangular protrusion 722 is provided for wedging and aligning with a correspondingly shaped crevice 323 in the front housing.

Around both sides of the first pinned 311 corner, at the edge of the recessed band and on each side of the band's centerline, larger triangular crevices or slanted corner slots 217 and 218 on the back housing 20 and slots 317 and 318 on the front housing 30 are formed within their tabs to initially receive and anchor lock engagement catches. However, next to the larger triangular crevices, a slightly smaller set of triangular crevices or slanted corner slots 277 and 288 on the back housing 20 and slots 377 and 388 on the front housing 30 are disposed closer to the pinned 311 corner for finally snapping, capturing and locking the latch in a tighter fit, after the latch is slid over the housing for the housing to capture the projected feet of the latch.

These lock engagement catches or securing tabs are preferably in the form of two pairs of triangular wedges 727 and 737 and 728 and 738 at the opposed edges or open ends 770 and 780 of the latch, respectively. In this preferred manner, both housings are symmetrically retainable by the latch at the same time.

Figure 5:
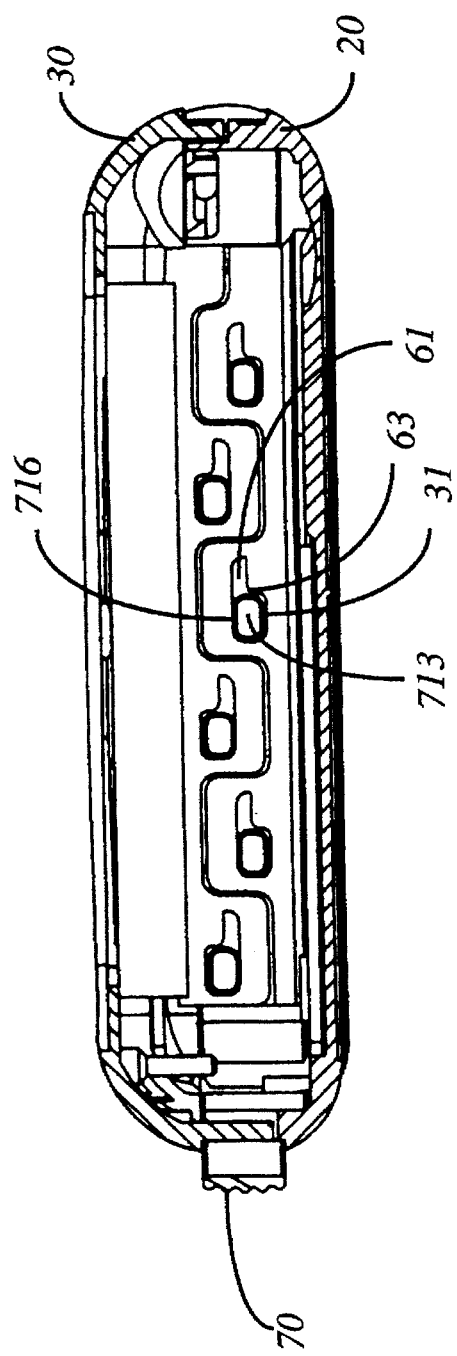
FIG. 5 is a cross-sectional drawing of the latch and the assembled pager housing of FIG. 1 in an inserted but unlatch position, in accordance with the present invention.
Figure 6:
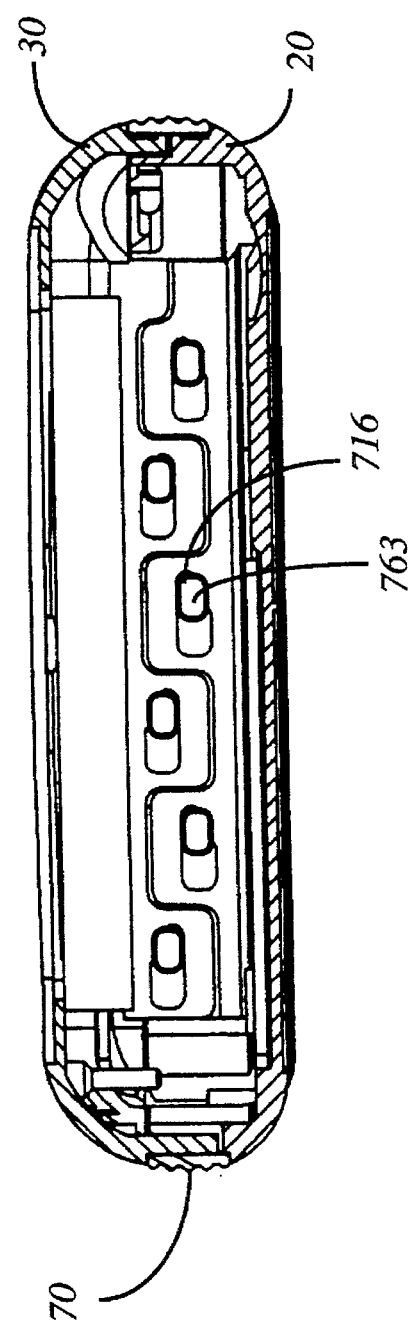
FIG. 6 is a side cross-sectional drawing of the latch and the assembled pager housing of FIG. 1 in a latched position, in accordance with the present invention.

Because a first and a fourth side of the housings, away from the battery cell compartment, have more space within their tabs, a plurality of elongated apostrophe mark-shaped apertures 31 can be formed within these alternating tabs, on both housings, with their smaller tail sections 61 facing the same direction on the same side of the housing, as seen in FIG. 5. Other protrusions, such as a plurality of larger webbed feet or projected and webbed L-shaped members 713 of the latch substantially alternate UP and DOWN, in alignment with the alternating tabs of both housings 20 and 30. These webbed feet have their squarish webs 716 face back-to-back on the fourth 774 and the first side 771 of the latch for sliding into and hooking with the smaller tail sections 61 of the apostrophe shaped apertures. With this complementary structure as seen in FIG. 6, the web 716 fits into the smaller tail section 61 while the corner 763 of the projected foot and leg is stopped by a corner portion 63 of the tab forming the characteristic turn of the apostrophe mark aperture.

Similarly, a smaller webbed foot 731 is hookable on the first side 771 of the latch with a smaller elongated apostrophe mark-shaped aperture 331, nearer a center line of the recessed border to help align the latch and housings.

Figure 7:
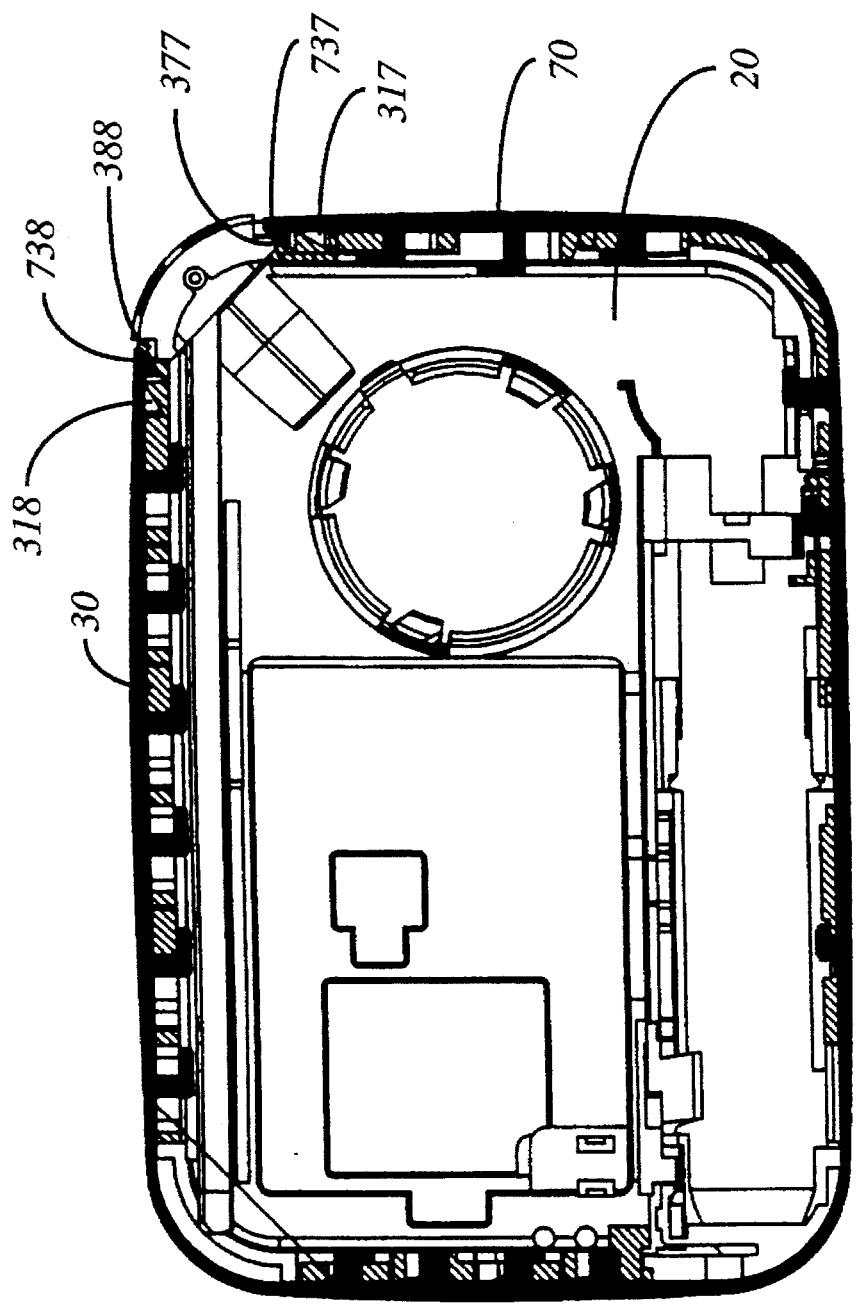
FIG. 7 is a top cross-sectional drawing of the latch and the assembled pager housing of FIG. 1 in a latched position, in accordance with the present invention.

To fasten the latch 70 around the interleaved pager housings 50 manually or robotically, the latch 70 is first opened further around the corners or otherwise operated upon to ensure that the latch can fit around the interleaved housings 50. The latch 70 is then aligned with the housings such that the various protrusions, such as the simply projected 705 or webbed 713 feet, of the latch can be inserted within the various cavities of the housings. Optionally, one or both pairs of the end wedges 727, 737, 728, and 738 of the latch can first be aligned or temporarily snapped into the larger pair of end crevices 217, 317, 218, 318 for stationary support while the rest of the latch is longitudinally pressed, slid, or latched into place. Next, the sides of the latch are manually pressed or robotically rolled by a roller, in the direction of where the webbed feet 713 or simply projected feet 705 are pointed to stretch the latch towards the pinned 311 corner and to capture the web 716 within the tail section 63 of the apostrophe aperture while the latch is stretched. Pressing or rolling is continued until the end wedges 727, 737, 728, and 738 have enough room to be finally snapped and locked into the end crevices 277, 377, 288, and 388. In this manner the latch forms part of the housings, because it is captured within the recessed border, as seen in FIG. 7. At the same time the latch could also serve as an aesthetic strip having various decorative features or simply colored to beautify the assembled pager.

What is claimed is:

1. A double-housing retainer assembly comprising:

a pair of interlocked housings having a recessed border and mating cavities in the recessed border: and a peripheral resilient latching band for fastening to the mating cavities around the recessed border, wherein the band comprises an open-ended trapezium housing latch comprising:

a first, shortest, side having a first free end;

a second, longest, side;

a first-to-second rounded corner connecting the first and second sides;

a third, next to shortest, side;

a second-to-third rounded corner connecting the second and third sides;

a fourth, next to longest, side having a second free end;

a third-to-fourth rounded corner connecting the third and fourth sides; and an opposed pair of locking members disposed at the first and second free ends for securing the latch around the recessed border of the housings.

2. The double-housing retainer assembly of claim 1, wherein the locking members comprise protrusions for insertion into the mating cavities.

3. The double-housing retainer assembly of claim 1, further comprising projected feet members disposed on the peripheral resilient latching band for insertion into the mating cavities.

4. The double-housing retainer assembly of claim 3, wherein the projected feet members comprise webbed feet for insertion into the mating cavities.

5. The double-housing retainer assembly of claim 4, wherein the mating cavities of the housings comprise apostrophe shaped apertures for receiving the webbed feet of the band.

6. The double-housing retainer assembly of claim 2; wherein the protrusions comprise wedges for insertion into the mating cavities.

7. The double-housing retainer assembly of claim 6, wherein the mating cavities of the housings comprise triangular crevices for receiving the wedges of the band.

8. A selective radio housing assembly, comprising:

a pair of interlocked housings having a recessed border and mating cavities in the recessed border; and a peripheral resilient latching band for fastening to the mating cavities around the recessed border, wherein the band comprises an open-ended trapezium housing latch comprising:

a first, shortest, side having a first free end:

a second, longest, side;

a first-to-second rounded corner connecting the first and second sides:

a third, next to shortest, side;

a second-to-third rounded corner connecting the second and third sides;

a fourth, next to longest, side having a second free end;

a third-to-fourth rounded corner connecting the third and fourth sides; and a plurality of protrusions disposed on the resilient latching band for securing the latch around the recessed border of the housings.

* * * * *